United States Patent
Zou et al.

(10) Patent No.: US 11,074,844 B2
(45) Date of Patent: Jul. 27, 2021

(54) SHIFT REGISTER AND METHOD FOR DRIVING THE SAME, GATE DRIVING CIRCUIT AND DISPLAY APPARATUS

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Yifeng Zou, Beijing (CN); Mindong Zheng, Beijing (CN); Chuanfeng Deng, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/835,698

(22) Filed: Mar. 31, 2020

(65) Prior Publication Data
US 2021/0035480 A1  Feb. 4, 2021

(30) Foreign Application Priority Data
Jul. 31, 2019  (CN) .......................... 201910702891.8

(51) Int. Cl.
G09G 3/36 (2006.01)
G09G 3/20 (2006.01)
G11C 19/28 (2006.01)

(52) U.S. Cl.
CPC ............... *G09G 3/20* (2013.01); *G11C 19/28* (2013.01); *G09G 2310/0286* (2013.01); *G09G 2320/02* (2013.01)

(58) Field of Classification Search
CPC . G09G 3/36; G09G 5/00; G11C 19/00; G02F 1/1345; G06F 3/038
See application file for complete search history.

(56) References Cited

U.S. PATENT DOCUMENTS

2016/0307641 A1* 10/2016 Zheng .................. G09G 3/3677
2017/0270892 A1* 9/2017 Wang ..................... G11C 19/28
2018/0190364 A1* 7/2018 Gu ............................ G11C 8/04

* cited by examiner

*Primary Examiner* — Pegeman Karimi
(74) *Attorney, Agent, or Firm* — Kinney & Lange, P.A.

(57) ABSTRACT

The present disclosure provides a shift register and a method for driving the same, a gate driving circuit, and a display apparatus. The shift register includes: a node control sub-circuit configured to control a potential at a pull-up node under control of a signal input terminal and a reset terminal; an output sub-circuit configured to provide an output signal to a signal output terminal based on a signal at a clock signal terminal under control of the pull-up node; and at least one gating sub-circuit connected to at least one de-noising node respectively, and each configured to de-noise a respective de-noising node connected thereto independently of the potential at the pull-up node under control of a trigger signal terminal, wherein the at least one de-noising node includes at least one of the pull-up node and the signal output terminal.

19 Claims, 8 Drawing Sheets

SHIFT REGISTER AND METHOD FOR DRIVING THE SAME, GATE DRIVING CIRCUIT AND DISPLAY APPARATUS

CROSS-REFERENCE TO RELATED APPLICATION(S)

This application claims priority to the Chinese Patent Application No. 201910702891.8, filed on Jul. 31, 2019, which is incorporated herein by reference in its entirety.

TECHNICAL FIELD

The present disclosure relates to the field of display technology, and more particularly, to a shift register and a method for driving the same, a gate driving circuit, and a display apparatus.

BACKGROUND

In recent years, Liquid Crystal Display (LCD) apparatuses and Organic Light Emitting Diode (OLED) display apparatuses have been widely applied in electronic products such as televisions, mobile phones etc. An LCD or OLED is composed of pixels in two directions which are a horizontal direction and a vertical direction, and each pixel in the display apparatus is driven for display by a driving circuit. The driving circuit primarily comprises a gate driving circuit and a data driving circuit. The data driving circuit is used to sequentially latch input data according to a clock signal timing, convert the latched data into an analog signal, and then input the analog signal into data lines of the display apparatus. The gate driving circuit is usually implemented by shift registers which convert a clock signal into a turn-on/turn-off voltage and outputs the turn-on/turn-off voltage to respective gate lines of the display apparatus. Each of the gate lines is usually connected to one shift register (i.e., one stage of shift register), and scanning of pixels in the display apparatus is achieved by causing the respective shift registers to sequentially output a turn-on voltage.

With the development of display technology, display apparatuses with a high-resolution and a narrow bezel have become a trend of development, and the Gate On Array (GOA) technology has appeared. The GOA technology is a technology which integrates a gate line driving circuit on an array substrate. An output of each GOA unit is used as an input of a next stage of GOA unit to generate output signals which are sequentially shifted to scan respective rows of pixels.

However, there is noise in the output signals of the conventional GOA architecture, which greatly affects the display quality.

SUMMARY

The embodiments of the present disclosure provide a shift register, comprising:

a node control sub-circuit connected to a signal input terminal, a reset terminal, and a pull-up node, and configured to control a potential at the pull-up node under control of the signal input terminal and the reset terminal;

an output sub-circuit connected to the pull-up node, a clock signal terminal, and a signal output terminal, and configured to provide an output signal to the signal output terminal based on a signal at the clock signal terminal under control of the pull-up node; and at least one gating sub-circuit connected to at least one de-noising node respectively, each gating sub-circuit is configured to de-noise a de-noising node connected thereto independently of the potential at the pull-up node under control of a trigger signal terminal, wherein the at least one de-noising node comprises at least one of the pull-up node and the signal output terminal.

In an example, each of the at least one gating sub-circuit comprises a switching sub-circuit and a de-noising sub-circuit, wherein the switching sub-circuit has a first terminal connected to the de-noising node, and a second terminal connected to the de-noising sub-circuit, and is configured to connect the first terminal to the second terminal or isolate the first terminal from the second terminal under control of the trigger signal terminal; and the de-noising sub-circuit is connected to a pull-down node and the second terminal of the switching sub-circuit, and is configured to de-noise the second terminal of the switching sub-circuit under control of the pull-down node.

In an example, the trigger signal terminal comprises a first trigger signal terminal and a second trigger signal terminal, and the switching sub-circuit comprises a first transistor, a second transistor, a third transistor, and a first capacitor, wherein the first transistor has a gate connected to a gating node, a first electrode acting as the first terminal of the switching sub-circuit, and a second electrode acting as the second terminal of the switching sub-circuit;

the second transistor has a gate connected to the first trigger signal terminal, a first electrode connected to a first voltage terminal, and a second electrode connected to the gating node;

the third transistor has a gate connected to the second trigger signal terminal, a first electrode connected to the gating node, and a second electrode connected to a second voltage terminal; and the first capacitor has a first terminal connected to the gating node, and a second terminal connected to the second voltage terminal.

In an example, the first trigger signal terminal is the reset terminal, and the second trigger signal terminal is connected to a signal input terminal of another shift register in a gate driving circuit where the shift register is located.

In an example, the pull-down node comprises a first pull-down node and a second pull-down node, and the de-noising sub-circuit comprises a fourth transistor and a fifth transistor, wherein the fourth transistor has a gate connected to the first pull-down node, a first electrode connected to the second terminal of the switching sub-circuit, and a second electrode connected to a second voltage terminal; and the fifth transistor has a gate connected to the second pull-down node, a first electrode connected to the second terminal of the switching sub-circuit, and a second electrode connected to the second voltage terminal.

In an example, the node control sub-circuit comprises:

a pull-up node control sub-circuit connected to the signal input terminal, the reset terminal, and the pull-up node, and configured to input a signal at the signal input terminal to the pull-up node, and reset the potential at the pull-up node under control of a signal at the reset terminal; and a pull-down node control sub-circuit connected to a first control terminal, a second control terminal, a first pull-down node and a second pull-down node, and configured to control a potential at the first pull-down node under control of a signal at the first control terminal and control a potential at the second pull-down node under control of a signal at the second control terminal.

In an example, the pull-up node control sub-circuit comprises a sixth transistor and a seventh transistor, wherein the sixth transistor has a gate and a first electrode connected to the signal input terminal, and a second electrode connected to the pull-up node; and the seventh transistor has a gate connected to the reset terminal, a first electrode connected to the pull-up node, and a second electrode connected to a second voltage terminal.

In an example, the pull-down node control sub-circuit comprises an eighth transistor, a ninth transistor, a tenth transistor, and an eleventh transistor, wherein the eighth transistor has a gate and a first electrode connected to the first control terminal, and a second electrode connected to a gate of the ninth transistor;

the ninth transistor has the gate connected to the second electrode of the eighth transistor, a first electrode connected to the first control terminal, and a second electrode connected to the first pull-down node;

the tenth transistor has a gate and a first electrode connected to the second control terminal, and a second electrode connected to a gate of the eleventh transistor; and the eleventh transistor has the gate connected to the second electrode of the tenth transistor, a first electrode connected to the second control terminal, and a second electrode connected to the second pull-down node.

In an example, the signal output terminal comprises a first signal output terminal and a second signal output terminal, and the output sub-circuit comprises a second capacitor, a twelfth transistor, and a thirteenth transistor, wherein the twelfth transistor has a gate connected to the pull-up node, a first electrode connected to the clock signal terminal, and a second electrode connected to the first signal output terminal;

the thirteenth transistor has a gate connected to the pull-up node, a first electrode connected to the clock signal terminal, and a second electrode connected to the second signal output terminal; and the second capacitor has a first terminal connected to the pull-up node, and a second terminal connected to the first signal output terminal.

In an example, the at least one de-noising node comprises the pull-up node, and the at least one gating sub-circuit comprises a first gating sub-circuit connected to the pull-up node.

In an example, the signal output terminal comprises a first signal output terminal, the at least one de-noising node comprises the pull-up node and the first signal output terminal, and the at least one gating sub-circuit comprises a first gating sub-circuit connected to the pull-up node and a second gating sub-circuit connected to the first signal output terminal.

In an example, the signal output terminal comprises a first signal output terminal and a second signal output terminal, the at least one de-noising node comprises the pull-up node, the first signal output terminal and the second signal output terminal, and the at least one gating sub-circuit comprises a first gating sub-circuit connected to the pull-up node, a second gating sub-circuit connected to the first signal output terminal, and a third gating sub-circuit connected to the second signal output terminal.

In an example, the signal output terminal comprises a first signal output terminal and a second signal output terminal, the at least one de-noising node comprises the pull-up node, the first signal output terminal and the second signal output terminal, and the at least one gating sub-circuit comprises a first gating sub-circuit connected to the pull-up node, a second gating sub-circuit connected to the first signal output terminal, and a third gating sub-circuit connected to the second signal output terminal.

The embodiments of the present disclosure further provide a gate driving circuit, comprising a plurality of cascaded shift registers described above, wherein a signal output terminal of an $n^{th}$ stage of shift register is connected to a signal input terminal of an $(n+3)^{th}$ stage of shift register and a reset terminal of an $(n-4)^{th}$ stage of shift register, wherein N is an integer greater than 4, n is an integer, and $4<n<N-3$.

In an example, a trigger signal terminal of each of the shift registers comprises a first trigger signal terminal and a second trigger signal terminal, wherein a first trigger signal terminal of the $n^{th}$ stage of shift register is a reset terminal of the $n^{th}$ stage of shift register, and a second trigger signal terminal of the $n^{th}$ stage of shift register is connected to a signal input terminal of an $(n-1)^{th}$ stage of shift register.

The embodiments of the present disclosure further provide a display apparatus, comprising the gate driving circuit described above.

The embodiments of the present disclosure further provide a method for driving the shift register described above, the method comprising:

controlling, by the node control sub-circuit, a potential at the pull-up node under control of the signal input terminal and the reset terminal;

providing, by the output sub-circuit, an output signal to the signal output terminal based on a signal at the clock signal terminal under control of the pull-up node; and de-noising, by each of the at least one gating sub-circuit, a de-noising node connected thereto independently of the potential at the pull-up node under control of a trigger signal terminal.

In an example, each of the at least one gating sub-circuit comprises a switching sub-circuit and a de-noising sub-circuit, and de-noising, by each of the at least one gating sub-circuit, a de-noising node connected thereto independently of the potential at the pull-up node under control of a trigger signal terminal comprises:

during a first period, isolating, by the switching sub-circuit of the gating sub-circuit, a first terminal of the switching sub-circuit from a second terminal of the switching sub-circuit under control of the trigger signal terminal; and during a second period, connecting, by the switching sub-circuit of the gating sub-circuit, the first terminal of the switching sub-circuit to the second terminal of the switching sub-circuit under control of the trigger signal terminal, and de-noising, by the de-noising sub-circuit of the gating sub-circuit, the second terminal of the switching sub-circuit of the gating sub-circuit under control of the pull-down node.

In an example, the trigger signal terminal comprises a first trigger signal terminal and a second trigger signal terminal, the switching sub-circuit comprises a first transistor, a second transistor, a third transistor, and a first capacitor, and for each gating sub-circuit, during a first part of the first period, the second trigger signal terminal is at a high level and the third transistor is turned on to pull down a potential at a gating node to a low level at a second voltage terminal, so as to turn off the first transistor; and during a second part of the first period, the second trigger signal is at a low level, and the first capacitor causes the gating node to be maintained at a low level, so as to cause the first transistor to be maintained to be turned off.

In an example, the trigger signal terminal comprises a first trigger signal terminal and a second trigger signal terminal, the switching sub-circuit comprises a first transistor, a second transistor, a third transistor and a first capacitor, and for each gating sub-circuit, during the second period, the first trigger signal terminal is at a high level and the second transistor is turned on to pull up a potential at a gating node to a high level at a first voltage terminal, so as to turn on the first transistor to cause the de-noising sub-circuit of the gating sub-circuit to be connected to the de-noising node, and the de-noising sub-circuit pulls down the potential at the de-noising node connected thereto to a low level at a second voltage terminal under control of the pull-down node.

BRIEF DESCRIPTION OF THE ACCOMPANYING DRAWINGS

The accompanying drawings are used to provide a further understanding of the technical solutions of the present disclosure, and constitute a part of the specification. The accompanying drawings are used to explain the technical solutions of the present disclosure together with the embodiments of the present application, and do not constitute limitations to the technical solutions of the present disclosure. Shapes and sizes of components in the accompanying drawings do not reflect true scales, and only aim to illustrate the present disclosure.

DETAILED DESCRIPTION

The specific implementations of the present disclosure will be described in further detail below with reference to the accompanying drawings and the embodiments. The following embodiments are used to illustrate the present disclosure, and are not used to limit the scope of the present disclosure. It should be illustrated that, the embodiments in the present application and the features in the embodiments may be arbitrarily combined with each other without conflict.

Unless otherwise defined, the technical terms or scientific terms disclosed in the embodiments of the present disclosure shall have the ordinary meanings understood by those of ordinary skill in the art to which the present disclosure belongs. The terms "first", "second", etc. used in the embodiments of the present disclosure do not indicate any order, quantity, or importance, but are only used to distinguish different components. Words such as "comprising" or "including" mean that an element or item appearing before the word encompasses elements or items appearing after the word and its equivalents without excluding other elements or items. Words such as "connected to" or "connected with" are not limited to physical or mechanical connections, but may comprise electrical connections, regardless of direct connection or indirect connection.

It may be understood by those skilled in the art that transistors used in all embodiments of the present disclosure may be thin film transistors or field effect transistors or other devices having the same characteristics. For example, the thin film transistors used in the embodiments of the present disclosure may be oxide semiconductor transistors. As a source and a drain of the switch transistor used here are symmetrical, the source and the drain are interchangeable. Therefore, in the embodiments of the present disclosure, in order to distinguish two electrodes of the transistor other than a gate, one of the electrodes is referred to as a first electrode, and the other of the electrodes is referred to as a second electrode. The first electrode may be a source or a drain, and the second electrode may be a drain or a source. Meanwhile, the thin film transistors or the field effect transistors may be n-type transistors, or may also be p-type transistors.

Figure 1:
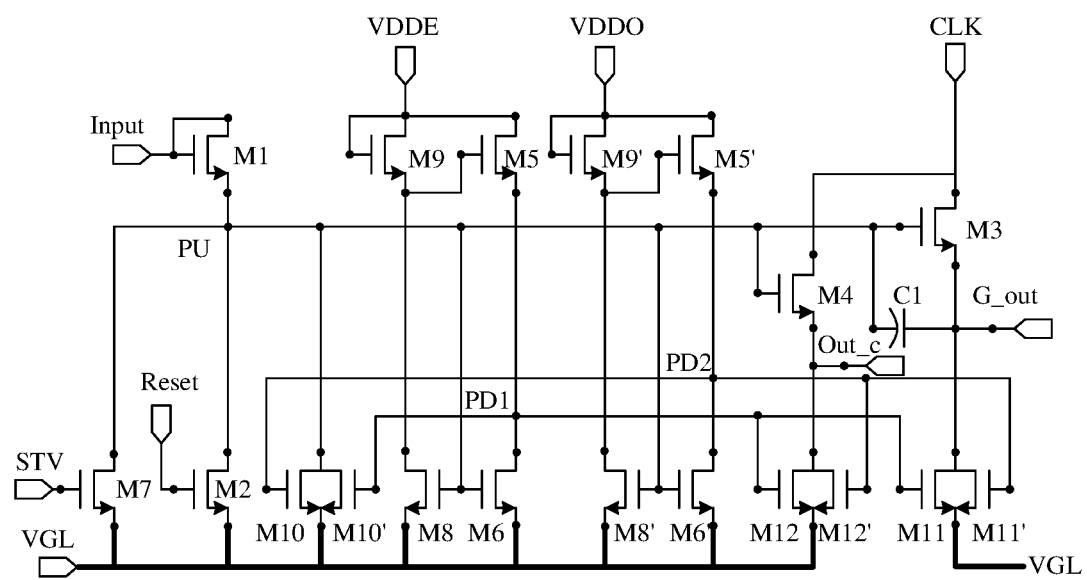
FIG. 1 is a schematic structural diagram of a shift register.

FIG. 1 is a schematic structural diagram of a shift register, which is a 19T1C direct current de-noising type shift register. The shift register is referred to as the direct current de-noising type shift register mainly because levels of input signals at a first control terminal VDDE and a second control terminal VDDO which are responsible for de-noising last for about 2 s to 3 s, and then are switched between a high level and a low level. With respect to a display time of one frame, the levels last for 2 s to 3 s, so that the input signals at the first control terminal VDDE and the second control terminal VDDO are constant direct current during one frame. Therefore, compared with an alternating current de-noising type shift register, the direct current de-noising type shift register is characterized by continuous de-noising during a non-output period, which improves a discharging effect and stability of an output signal. However, due to the continuous de-noising of the direct current de-noising type shift register, a pull-up node is insufficiently charged. As shown in FIG. 1, the pull-up node PU is connected to gates of a transistor M6 and a transistor M8 to control pull-down of a first pull-down node PD1, and is connected to gates of a transistor M6' and a transistor M8' to control pull-down of a second pull-down node PD2. The first pull-down node PD1 and the second pull-down node PD2 are connected to gates of transistors M10 and M10' respectively, to control pull-down of the pull-up node PU. Since the pull-up node PU controls pull-down of the first pull-down node PD1 and the second pull-down node PD2, and the first pull-down node PD1 and the second pull-down node PD2 control pull-down of the pull-up node PU, during an operation of the shift register, there is a competitive relationship between the pull-up node PU and the first pull-down node PD1 and the second pull-down node PD2 (hereinafter collectively referred to as pull-down nodes PD). When a charging capability of the pull-up node PU is balanced with a de-noising capability of the pull-down node PD, the shift register may operate normally, but when there is an improper design or characteristic drift which causes the charging capability to be unbalanced with the de-noising capability, it may seriously affect the operation of the shift register. When the charging capability of the pull-up node PU is stronger than the de-noising capability of the pull-down node PD, the pull-up node PU has noise at a low level, which may cause an undesired high level in an output signal at a signal output terminal G_out; and when the de-noising capability of the pull-down node PD is stronger than the charging capability of the pull-up node PU, the pull-up node PU is insufficiently charged, which results in that the output signal at the signal output terminal G_out may not reach a desired level, that is, an output of a gate driving signal is insufficient.

The embodiments of the present disclosure provide a shift register and a method for driving the same, a gate driving circuit, and a display apparatus. Gating sub-circuits are provided to realize de-noising in a time division manner, so that a charging process is separated from a de-noising process, thereby improving the stability and reliability of the operation of the shift register, improving the display quality and extending the service life. Of course, it is not necessary that any of products or methods according to the present disclosure is implemented to achieve all the advantages described above at the same time. Other features and advantages of the present disclosure will be explained in the embodiments in the following description, and partly become apparent from the embodiments in the description, or may be understood by implementing the present disclosure. The purposes and other advantages of the embodiments of the present disclosure may be achieved and obtained by structures which are specifically pointed out in the description, the claims, and the accompanying drawings.

Figure 2:
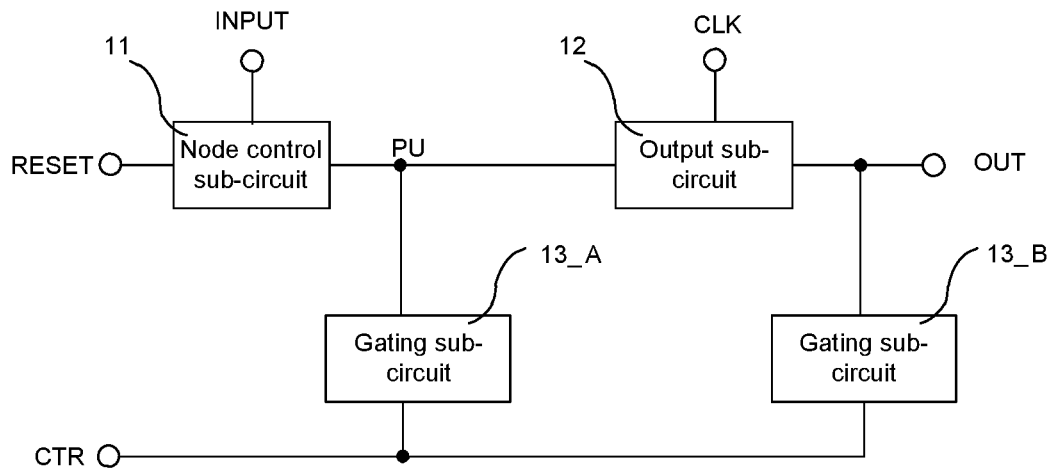
FIG. 2 is a schematic structural diagram of a shift register according to an embodiment of the present disclosure.

The embodiments of the present disclosure provide a shift register, which is disposed on an array substrate. FIG. 2 is a schematic structural diagram of a shift register according to an embodiment of the present disclosure. As shown in FIG. 2, the shift register comprises a signal input terminal INPUT, a reset terminal RESET, a clock signal terminal CLK, and a signal output terminal OUT, and further comprises a node control sub-circuit 11, an output sub-circuit 12, and at least one gating sub-circuit. Two gating sub-circuits 13_A and 13_B (collectively referred to as a gating sub-circuit 13) are shown in FIG. 2; however, the embodiments of the present disclosure are not limited thereto, and the shift register may comprise more or less gating sub-circuits as needed, which will be described in detail below.

The node control sub-circuit 11 is connected to the signal input terminal INPUT, the reset terminal RESET and the pull-up node PU respectively, and is used to control a potential at the pull-up node PU under control of the signal input terminal INPUT and the reset terminal RESET.

The output sub-circuit 12 is connected to the pull-up node PU, the clock signal terminal CLK, and the signal output terminal OUT respectively, and is used to provide an output signal to the signal output terminal OUT based on a signal at the clock signal terminal CLK under control of the pull-up node PU. In some embodiments, the signal output terminal OUT may comprise a first signal output terminal G_out and a second signal output terminal Out_C, and the output sub-circuit 12 may provide a first output signal and a second output signal to the first signal output terminal G_out and the second signal output terminal Out_C respectively. The first output signal at the first signal output terminal G_out may be output as a gate driving signal for scanning pixels on a display panel; and the second output signal at the second signal output terminal Out_C may be provided to other shift register unit(s), so as to achieve shifted output, which will be described in further detail below.

The at least one gating sub-circuit 13 is connected to at least one de-noising node respectively, and the at least one de-noising node may comprise at least one of the pull-up node PU and the signal output terminal OUT. For example, in FIG. 2, the gating sub-circuit 13_A is connected to the pull-up node PU, and the gating sub-circuit 13_B is connected to the signal output terminal OUT. Each gating sub-circuit 13 may de-noise the de-noising node connected thereto independently of the potential at the pull-up node PU under control of a trigger signal terminal CTR.

Figure 3:
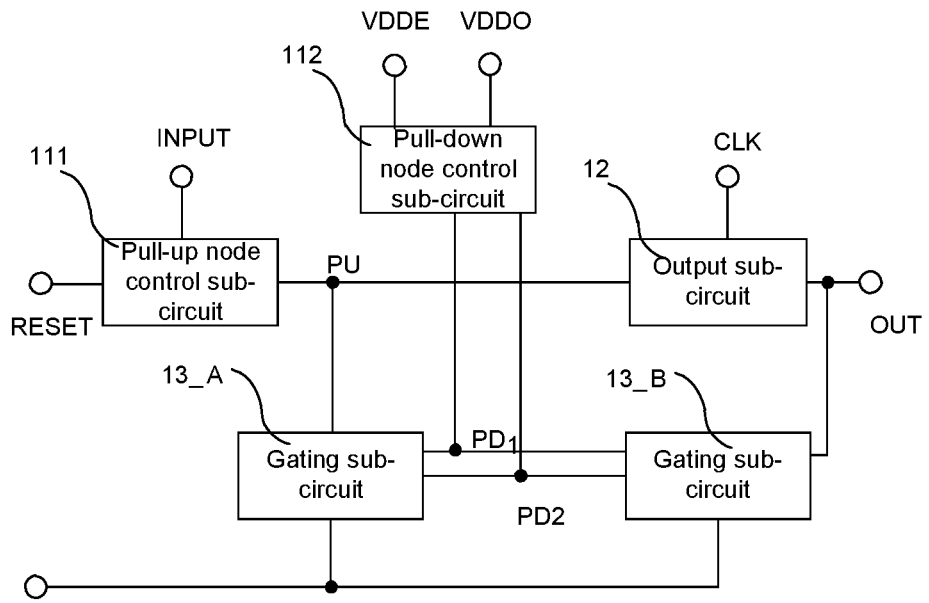
FIG. 3 is a schematic structural diagram of a shift register according to another embodiment of the present disclosure.

FIG. 3 is a schematic structural diagram of a shift register according to another embodiment of the present disclosure, in which an exemplary structure of the node control sub-circuit 11 is shown. As shown in FIG. 3, the node control sub-circuit 11 comprises a pull-up node control sub-circuit 111 and a pull-down node control sub-circuit 112.

The pull-up node control sub-circuit 111 is connected to the signal input terminal INPUT, the reset terminal RESET, and the pull-up node PU respectively. The pull-up node control sub-circuit 111 may input a signal at the signal input terminal INPUT to the pull-up node PU, and reset the potential at the pull-up node PU under control of a signal at the reset terminal RESET. For example, the pull-up node control sub-circuit 111 may control the potential at the pull-up node PU to be at a high level when the input signal at the signal input terminal INPUT is at a high level, and may control the potential at the pull-up node PU to be at a low level when the input signal at the reset terminal RESET is at a high level.

The pull-down node control sub-circuit 112 is connected to a first control terminal VDDE, a second control terminal VDDO, a first pull-down node PD1, and a second pull-down node PD2 respectively. The pull-down node control sub-circuit 112 may control a potential at the first pull-down node PD1 under control of a signal at the first control terminal VDDE, and control a potential at the second pull-down node PD2 under control of a signal at the second control terminal. For example, the pull-down node control sub-circuit 112 may control the potential at the first pull-down node PD1 to be at a high level when the input signal at the first control terminal VDDE is at a high level, and may control the potential at the second pull-down node PD2 to be at a high level when the input signal at the second control terminal VDDO is at a high level.

Figure 4:
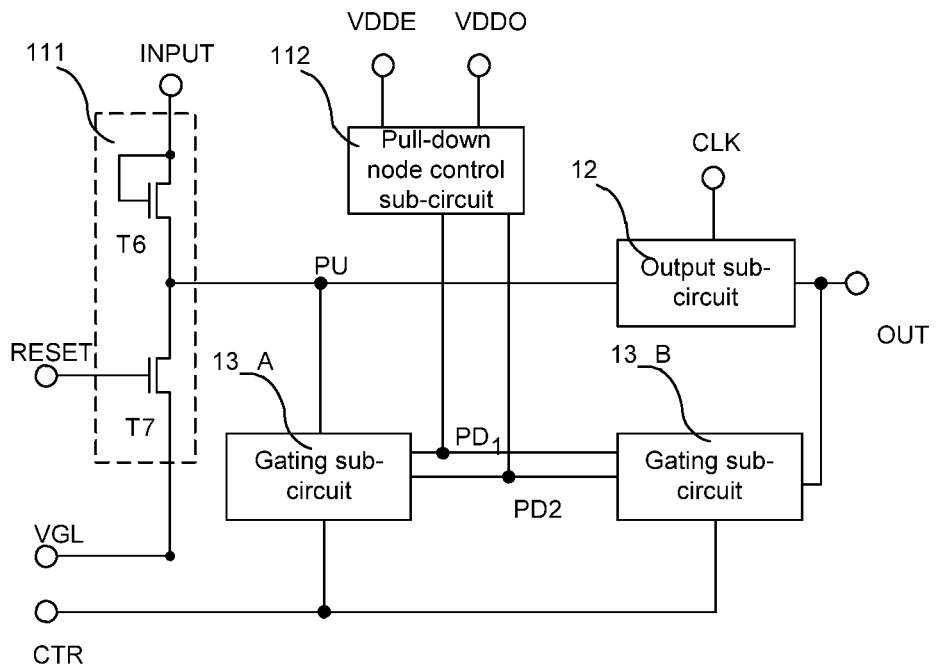
FIG. 4 is a schematic structural diagram of a shift register according to another embodiment of the present disclosure.

FIG. 4 is a schematic structural diagram of a shift register according to another embodiment of the present disclosure, in which an exemplary structure of the pull-up node control sub-circuit 111 is shown. As shown in FIG. 4, the pull-up node control sub-circuit 111 comprises a sixth transistor T6 and a seventh transistor T7.

The sixth transistor T6 has a gate and a first electrode connected to the signal input terminal INPUT, and a second electrode connected to the pull-up node PU. The sixth transistor T6 may be turned on when the input signal at the signal input terminal INPUT is at a high level to pull up the potential at the pull-up node PU, so as to charge a capacitor in the output sub-circuit 12.

The seventh transistor T7 has a gate connected to the reset terminal RESET, a first electrode connected to the pull-up node PU, and a second electrode connected to a second voltage terminal (for example, a low-level input terminal)

VGL. The seven transistor T7 may be turned on when the input signal at the reset terminal RESET is at a high level to discharge the pull-up node PU, so as to pull down the potential at the pull-up node PU to a low level at the low-level input terminal VGL.

Figure 5:
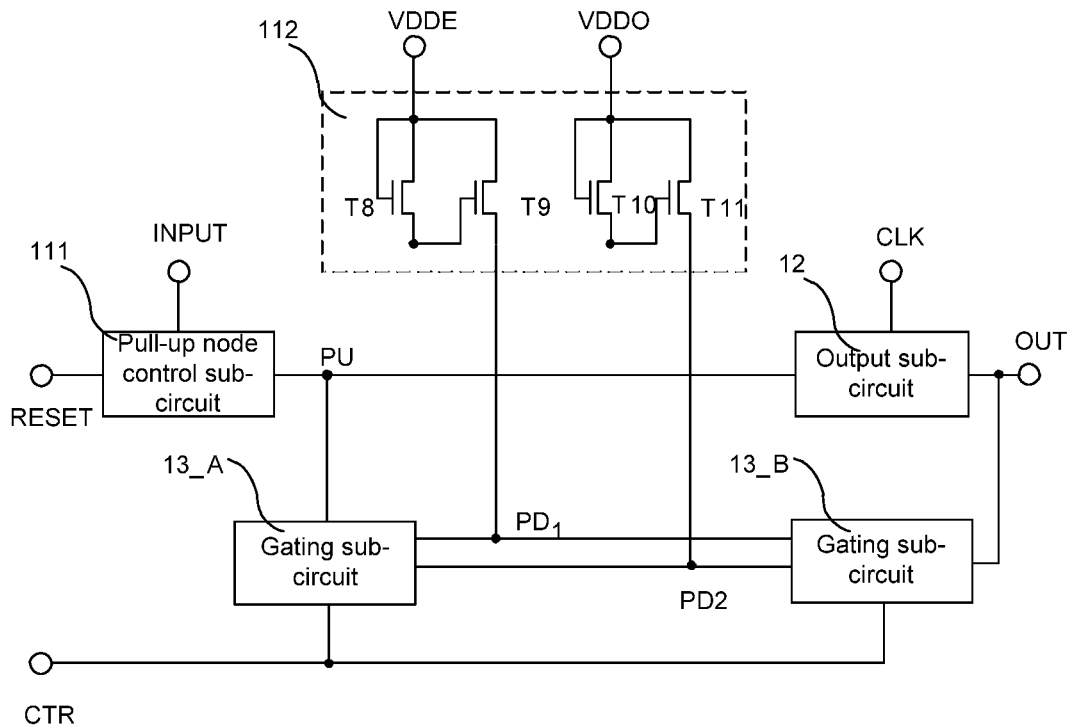
FIG. 5 is a schematic structural diagram of a shift register according to another embodiment of the present disclosure.

FIG. 5 is a schematic structural diagram of a shift register according to another embodiment of the present disclosure, in which an exemplary structure of the pull-down node control sub-circuit 112 is shown. As shown in FIG. 5, the pull-down node control sub-circuit 112 comprises an eighth transistor T8, a ninth transistor T9, a tenth transistor T10, and an eleventh transistor T11.

The eighth transistor T8 has a gate and a first electrode connected to the first control terminal VDDE, and a second electrode connected to a gate of the ninth transistor T9. The eighth transistor T8 may be turned on when an input signal at the first control terminal VDDE is at a high level, so as to control the ninth transistor T9 to be turned on.

The ninth transistor T9 has the gate connected to the second electrode of the eighth transistor T8, a first electrode connected to the first control terminal VDDE, and a second electrode connected to the first pull-down node PD1. The ninth transistor T9 may pull up the potential at the first pull-down node PD1 when the ninth transistor T9 is turned on.

The tenth transistor T10 has a gate and a first electrode connected to the second control terminal VDDO, and a second electrode connected to a gate of the eleventh transistor T11. The tenth transistor T10 may be turned on when the input signal at the second control terminal VDDO is at a high level, so as to control the eleventh transistor T11 to be turned on.

The eleventh transistor T11 has the gate connected to the second electrode of the tenth transistor T10, a first electrode connected to the second control terminal VDDO, and a second electrode connected to the second pull-down node PD2. The eleventh transistor T11 may pull up the potential at the second pull-down node PD2 when the eleventh transistor T11 is turned on.

Figure 6:
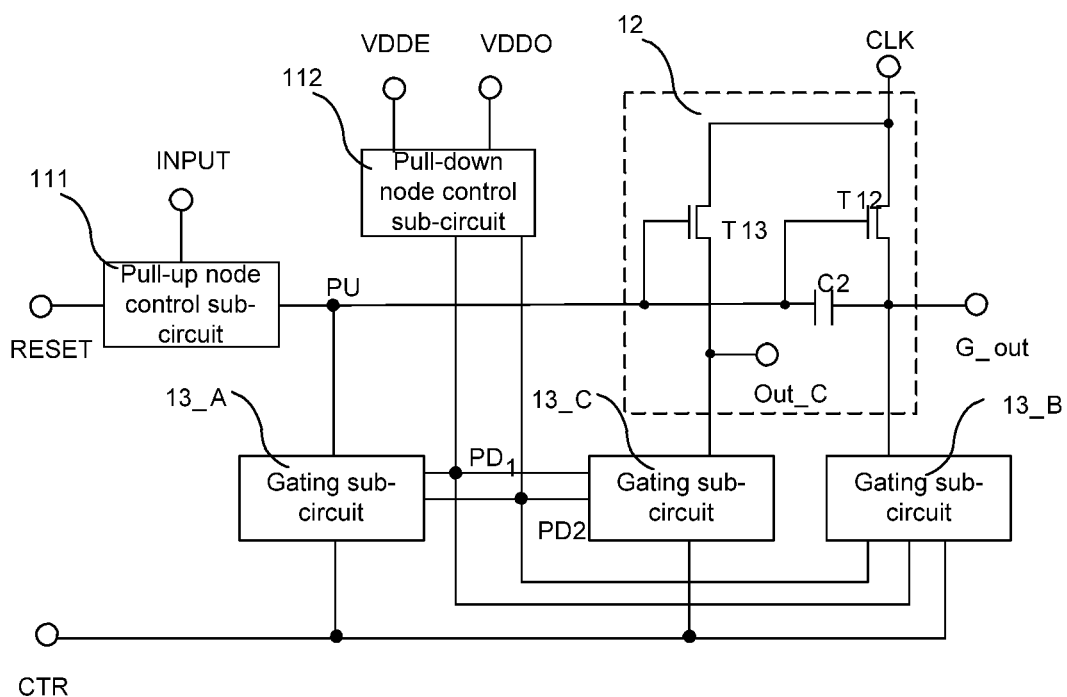
FIG. 6 is a schematic structural diagram of a shift register according to another embodiment of the present disclosure.

FIG. 6 is a schematic structural diagram of a shift register according to another embodiment of the present disclosure, in which an exemplary structure of the output sub-circuit 12 is shown. As shown in FIG. 6, the output sub-circuit 12 comprises a twelfth transistor T12, a thirteenth transistor T13, and a second capacitor C2.

The twelfth transistor T12 has a gate connected to the pull-up node PU, a first electrode connected to the clock signal terminal CLK, and a second electrode connected to the first signal output terminal G_out. The twelfth transistor T12 may be turned on when the pull-up node PU is at a high level, so as to input the signal at the clock signal terminal CLK to the first signal output terminal G_out, so that the signal at the clock signal terminal CLK is output from the first signal output terminal G_out as a first output signal (acting as a gate driving signal).

The thirteenth transistor T13 has a gate connected to the pull-up node PU, a first electrode connected to the clock signal terminal CLK, and a second electrode connected to the second signal output terminal Out_C. The thirteenth transistor T13 may be turned on when the pull-up node PU is at a high level, so as to input the signal at the clock signal terminal CLK to the second signal output terminal Out_C, so that the signal at the clock signal terminal CLK is output from the second signal output terminal Out_C as a second output signal (to be provided to other shift register units).

The second capacitor C2 has a first terminal connected to the pull-up node PU, and a second terminal connected to the first signal output terminal G_out. The second capacitor C2 may be charged when the potential at the pull-up node PU is pulled up.

In FIG. 6, each of the pull-up node PU, the first signal output terminal G_out, and the second signal output terminal Out_C of the shift register is connected to one gating sub-circuit. As shown in FIG. 6, the gating sub-circuit 13_A is connected to the pull-up node PU to de-noise the pull-up node PU, the gating sub-circuit 13_B is connected to the first signal output terminal G_out to de-noise the first signal output terminal G_out, and the gating sub-circuit 13_C is connected to the second signal output terminal Out_C to de-noise the second signal output terminal Out_C, which will be described in further detail below.

Figure 7:
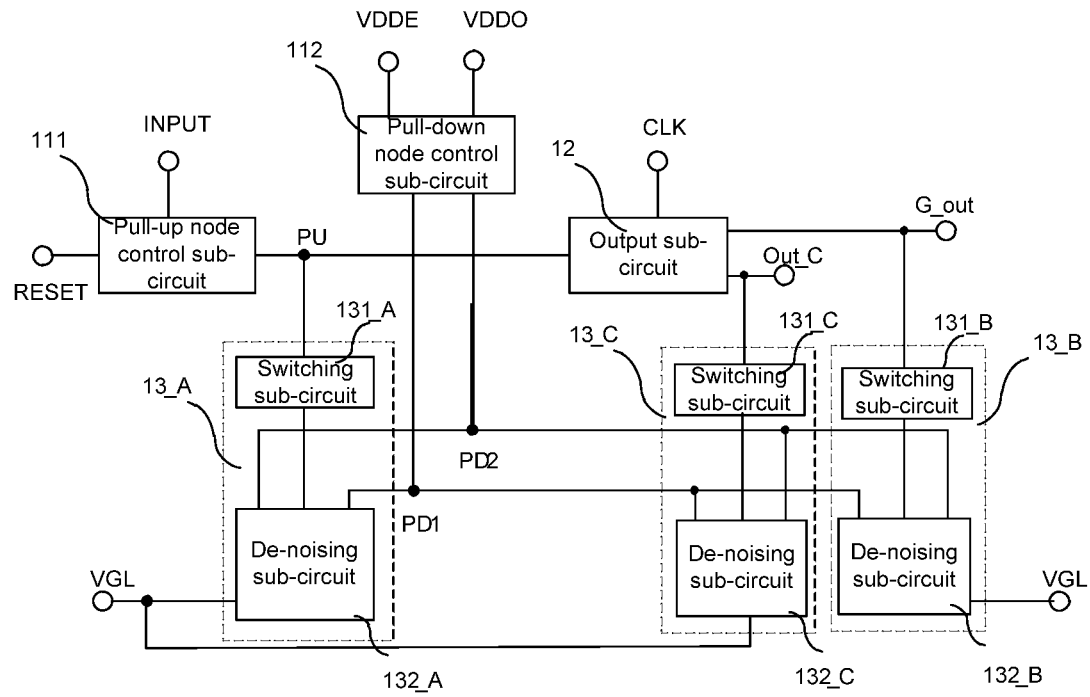
FIG. 7 is a schematic structural diagram of a shift register according to another embodiment of the present disclosure.

FIG. 7 is a schematic structural diagram of a shift register according to another embodiment of the present disclosure, in which a schematic structural diagram of the gating sub-circuit 13 is shown. As shown in FIG. 7, the shift register comprises at least one gating sub-circuit, for example, a gating sub-circuit 13_A (a first gating sub-circuit), a gating sub-circuit 13_B (a second gating sub-circuit), and a gating sub-circuit 13_C (a third gating sub-circuit) (which are collectively referred to as gating sub-circuits13).

Each of the gating sub-circuits 13 comprises a switching sub-circuit and a de-noising sub-circuit. For example, the gating sub-circuit 13_A comprises a switching sub-circuit 131_A and a de-noising sub-circuit 132_A, the gating sub-circuit 13_B comprises a switching sub-circuit 131_B and a de-noising sub-circuit 132_B, and the gating sub-circuit 13_C comprises a switching sub-circuit 131_C and a de-noising sub-circuit 132_C.

The switching sub-circuit 131_A has a first terminal connected to the pull-up node PU, and a second terminal connected to the de-noising sub-circuit 132_A. The de-noising sub-circuit 132_A is connected to pull-down nodes (a first pull-down node PD1 and a second pull-down node PD2 in the example of FIG. 7) and a second voltage terminal VGL. The switching sub-circuit 131_A may isolate the first terminal from the second terminal or connect the first terminal to the second terminal under control of a trigger signal at the trigger signal terminal. The trigger signal terminal is not shown in FIG. 7 for the sake of simplicity, and will be described in detail below with reference to FIG. 8. When the first terminal of the switching sub-circuit 131_A is isolated from the second terminal of the switching sub-circuit 131_A, the de-noising sub-circuit 132_A is isolated from the pull-up node PU, so that the de-noising circuit 132_A does not affect the potential at the pull-up node PU; and when the first terminal of the switching sub-circuit 131_A is connected to the second terminal of the switching sub-circuit 131_A, the de-noising sub-circuit 132_A is connected to the pull-up node PU, so that the de-noising sub-circuit 132_A may pull down the potential at the pull-up node PU to a low level at the second voltage terminal VGL, so as to realize de-noising of the pull-up node PU. In this way, the de-noising may be performed by the de-noising sub-circuit 132_A independently of the potential at the pull-up node PU, so as to avoid insufficient charging of the pull-up node PU due to the de-noising which may otherwise affect the stability of the output signal.

Similarly, the switching sub-circuit 131_B has a first terminal connected to the first signal output terminal G_out, and a second terminal connected to the de-noising sub-circuit 132_B, so that the first signal output terminal G_out is isolated from the de-noising sub-circuit 132_B or the first signal output terminal G_out is connected to the de-noising sub-circuit 132_B under control of the trigger signal at the trigger signal terminal. The de-noising sub-circuit 132_B is connected to the first pull-down node PD1, the second pull-down node PD2, and the second voltage terminal VGL, so that when the de-noising sub-circuit 132_B is connected to the first signal output terminal G_out through the switching sub-circuit 131_B, the first signal output terminal G_out is de-noised under control of the first pull-down node PD1 and the second pull-down node PD2.

Similarly, the switching sub-circuit 131_C has a first terminal connected to the second signal output terminal Out_C, and a second terminal connected to the de-noising sub-circuit 132_C, so that the second signal output terminal Out_C is isolated from the de-noising sub-circuit 132_C or the second signal output terminal Out_C is connected to the de-noising sub-circuit 132_C under control of the trigger signal at the trigger signal terminal. The de-noising sub-circuit 132_B is connected to the first pull-down node PD1, the second pull-down node PD2, and the second voltage terminal VGL, so that when the de-noising sub-circuit 132_B is connected to the second signal output terminal Out_C through the switching sub-circuit 131_C, the second signal output terminal Out_C is de-noised under control of the first pull-down node PD1 and the second pull-down node PD2.

Figure 8:
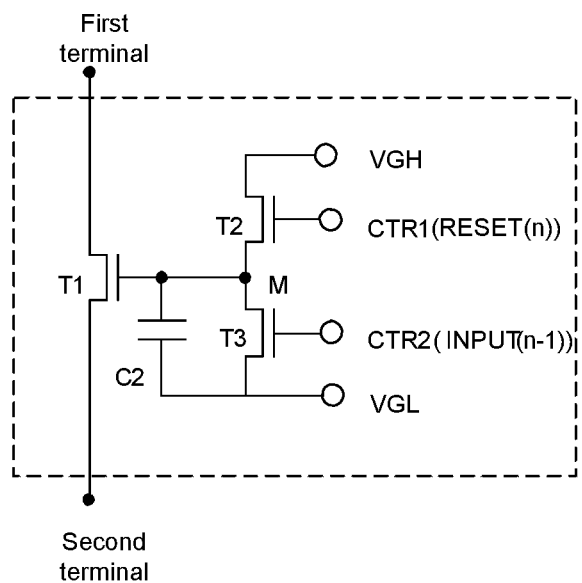
FIG. 8 is a schematic structural diagram of a switching sub-circuit in a gating sub-circuit according to an embodiment of the present disclosure.

FIG. 8 is a schematic structural diagram of a switching sub-circuit in a gating sub-circuit according to an embodiment of the present disclosure. The switching sub-circuits (for example, the switching sub-circuits 131_A, 131_B, and 131_C in FIG. 7) in the above gating sub-circuits may all have the structure shown in FIG. 8. As shown in FIG. 8, the switching sub-circuit may be connected to trigger signal terminals, for example, a first trigger signal terminal CTR1 and a second trigger signal terminal CTR2. In some embodiments, the second trigger signal terminal CTR2 may be connected to a signal input terminal INPUT(n−1) of a last stage of shift register, and the first trigger signal terminal CTR1 may be a reset terminal RESET(n) of a current stage of shift register. The switching sub-circuit is also connected to a first voltage terminal (for example, a high-level input terminal) VGH, a second voltage terminal (for example, a low-level input terminal) VGL, and a gating node M. The switching sub-circuit comprises a first capacitor C1, a first transistor T1, a second transistor T2, and a third transistor T3.

The first transistor T1 has a gate connected to the gating node M, a first electrode acting as a first terminal of the switching sub-circuit, and a second electrode acting as a second terminal of the switching sub-circuit. The first transistor T1 may be turned on when the gating node M is at a high level, so that the first terminal of the switching sub-circuit is connected to the second terminal of the switching sub-circuit. For example, in the above first gating sub-circuit (the gating sub-circuit 13_A), the first electrode of the first transistor T1 is connected to the pull-up node PU as the first terminal of the switching sub-circuit 131_A, and the second electrode of the first transistor T1 is connected to the de-noising sub-circuit 132_A as the second terminal of the switching sub-circuit. The first transistor T1 of the switching sub-circuit 131_A may be turned on when the gating node M is at a high level, so that the de-noising sub-circuit 132_A discharges the pull-up node PU, to pull down the potential at the pull-up node PU to the low level at the low-level input terminal VGL. For the second gating sub-circuit (the gating sub-circuit 13_B), the first electrode of the first transistor T1 is connected to the first signal output terminal G_out as the first terminal of the switching sub-circuit 131_B, and the second electrode of the first transistor T1 is connected to the de-noising sub-circuit 132_B as the second terminal of the switching sub-circuit 131_B. The first transistor T1 of the switching sub-circuit 131_B may be turned on when the gating node M is at a high level, so that the de-noising sub-circuit 132_B discharges the first signal output terminal G_out, to pull down a potential at the first signal output terminal G_out to the low level at the low-level input terminal VGL. For the third gating sub-circuit (the gating sub-circuit 13_C), the first electrode of the first transistor T1 is connected to the second signal output terminal Out_C as the first terminal of the switching sub-circuit 131_C, and the second electrode of the first transistor T1 is connected to the de-noising sub-circuit 132_C as the second terminal of the switching sub-circuit 131_C. The first transistor T1 of the switching sub-circuit 131_C may be turned on when the gating node M is at a high level, so that the de-noising sub-circuit 132_C discharges the second signal output terminal Out_C, to pull down a potential at the second signal output terminal Out_C to the low level at the low-level input terminal VGL.

The second transistor T2 has a gate connected to the first trigger signal terminal CTR1 (for example, the reset terminal RESET(n) of the current stage of shift register), a first electrode connected to the high-level input terminal VGH, and a second electrode connected to the gating node M. The second transistor T2 may be turned on when the input signal at the reset terminal RESET(n) of the current stage of shift register is at a high level, so as to pull up the potential at the gating node M, thereby charging the first capacitor C1.

The third transistor T3 has a gate connected to the second trigger signal terminal CTR2 (for example, the signal input terminal INPUT(n−1) of the last stage), a first electrode connected to the gating node M, and a second electrode connected to the low-level input terminal VGL. The third transistor T3 may be turned on when an input signal at the signal input terminal INPUT(n−1) of the last stage is at a high level to discharge the gating node M, thereby pulling down the potential at the gating node M to the low level at the low-level input terminal VGL.

The first capacitor C1 has a first terminal connected to the gating node M, and a second terminal connected to the low-level input terminal VGL. The first capacitor C1 may be charged when the potential at the gating node M is pulled up.

Figure 9:
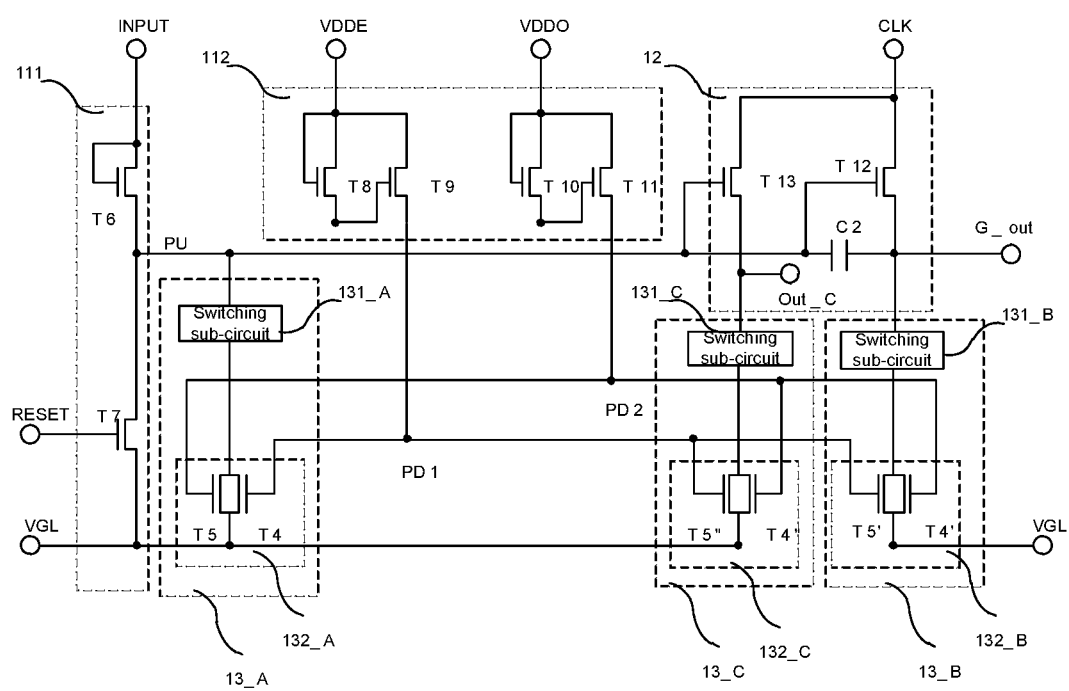
FIG. 9 is a circuit diagram of a shift register according to another embodiment of the present disclosure.

FIG. 9 is a circuit diagram of a shift register according to an embodiment of the present disclosure. As shown in FIG. 9, the shift register comprises a node control sub-circuit, an output sub-circuit 12, and at least one gating sub-circuit. The node control sub-circuit comprises a pull-up node control sub-circuit 111 and a pull-down node control sub-circuit 112. The at least one gating sub-circuit comprises gating sub-circuits 13_A, 13_B, and 13_C. The pull-up node control sub-circuit 111 may have the structure of the pull-up node control sub-circuit 111 shown in FIG. 4, and the pull-down node control sub-circuit 112 may have the structure of the pull-down node control sub-circuit 112 shown in FIG. 5. The output sub-circuit 12 may have a structure of an output sub-circuit 12 shown in FIG. 6.

In FIG. 9, a switching sub-circuit in each of the gating sub-circuits 13_A, 13_B, and 13_C may have the structure shown in FIG. 8, for example, each of the switching sub-circuits 131_A, 131_B, and 131_C may have the structure shown in FIG. 8. A de-noising sub-circuit in each of the gating sub-circuits 13_A, 13_B, and 13_C may comprise a fourth transistor and a fifth transistor, for example, a de-noising sub-circuit 132A may comprise a fourth transistor T4 and a fifth transistor T5, a de-noising sub-circuit 132_B may comprise a fourth transistor T4' and a fifth transistor T5', and a de-noising sub-circuit 132_C may comprise a fourth transistor T4" and a fifth transistor T5".

The switching sub-circuit 131_A has a first terminal connected to a pull-up node PU, and a second terminal connected to a first electrode of the fourth transistor T4 and a first electrode of the fifth transistor T5. The switching sub-circuit 131_A may be turned on under driving of a trigger signal, and the pull-up node PU is discharged by the fourth transistor T4 and the fifth transistor T5 respectively under control of a first pull-down node PD1 and a second pull-down node PD2, so as to pull down a potential at the pull-up node PU to a low level at a low-level input terminal VGL.

The switching sub-circuit 131_B has a first terminal connected to a first signal output terminal G_out, and a second terminal connected to a first electrode of the fourth transistor T4' and a first electrode of the fifth transistor T5'. The switching sub-circuit 131_B may be turned on under driving of a trigger signal, and the first signal output terminal G_out is discharged by the fourth transistor T4' and the fifth transistor T5' respectively under control of the first pull-down node PD1 and the second pull-down node PD2, so as to pull down a potential at the first signal output terminal G_out to the low level at the low-level input terminal VGL.

The switching sub-circuit 131_C has a first terminal connected to a second signal output terminal Out_C, and a second terminal connected to a first electrode of the fourth transistor T4" and a first electrode of the fifth transistor T5". The switching sub-circuit 131_C may be turned on under driving of a trigger signal, and the second signal output terminal Out_C is discharged by the fourth transistor T4" and the fifth transistor T5" respectively under control of the first pull-down node PD1 and the second pull-down node PD2, so as to pull down a potential at the second signal output terminal Out_C to the low level at the low-level input terminal VGL.

The fourth transistor T4 has a gate connected to the first pull-down node PD1, the first electrode connected to the second terminal of the switching sub-circuit 131_A, and a second electrode connected to the low-level input terminal VGL. The fourth transistor T4 may be turned on when the first pull-down node PD1 is at a high level, so as to pull down a potential at the second terminal of the switching sub-circuit 131_A to the low level at the low-level input terminal VGL.

The fourth transistor T4' has a gate connected to the first pull-down node PD1, the first electrode connected to the second terminal of the switching sub-circuit 131_B, and a second electrode connected to the low-level input terminal VGL. The fourth transistor T4' may be turned on when the first pull-down node PD1 is at a high level, so as to pull down a potential at the second terminal of the switching sub-circuit 131_B to the low level at the low-level input terminal VGL, The fourth transistor T4" has a gate connected to the first pull-down node PD1, the first electrode connected to the second terminal of the switching sub-circuit 131_C, and a second electrode connected to the low-level input terminal VGL. The fourth transistor T4" may be turned on when the first pull-down node PD1 is at a high level, so as to pull down a potential at the second terminal of the switching sub-circuit 131_C to the low level at the low-level input terminal VGL.

The fifth transistor T5 has a gate connected to the second pull-down node PD2, the first electrode connected to the second terminal of the switching sub-circuit 131_A, and a second electrode connected to the low-level input terminal VGL. The fifth transistor T5 may be turned on when the second pull-down node PD2 is at a high level, so as to pull down the potential at the second terminal of the switching sub-circuit 131_A to the low level at the low-level input terminal VGL.

The fifth transistor T5' has a gate connected to the second pull-down node PD2, the first electrode connected to the second terminal of the switching sub-circuit 131_B, and a second electrode connected to the low-level input terminal VGL. The fifth transistor T5' may be turned on when the second pull-down node PD2 is at a high level, so as to pull down the potential at the second terminal of the switching sub-circuit 131_B to the low level at the low-level input terminal VGL.

The fifth transistor T5" has a gate connected to the second pull-down node PD2, the first electrode connected to the second terminal of the switching sub-circuit 131_C, and a second electrode connected to the low-level input terminal VGL. The fifth transistor T5" may be turned on when the second pull-down node PD2 is at a high level, so as to pull down the potential at the second terminal of the switching sub-circuit 131_C to the low level at the low-level input terminal VGL.

The technical solutions according to the embodiments of the present disclosure will be further described below through an operating process of a shift register.

Figure 10:
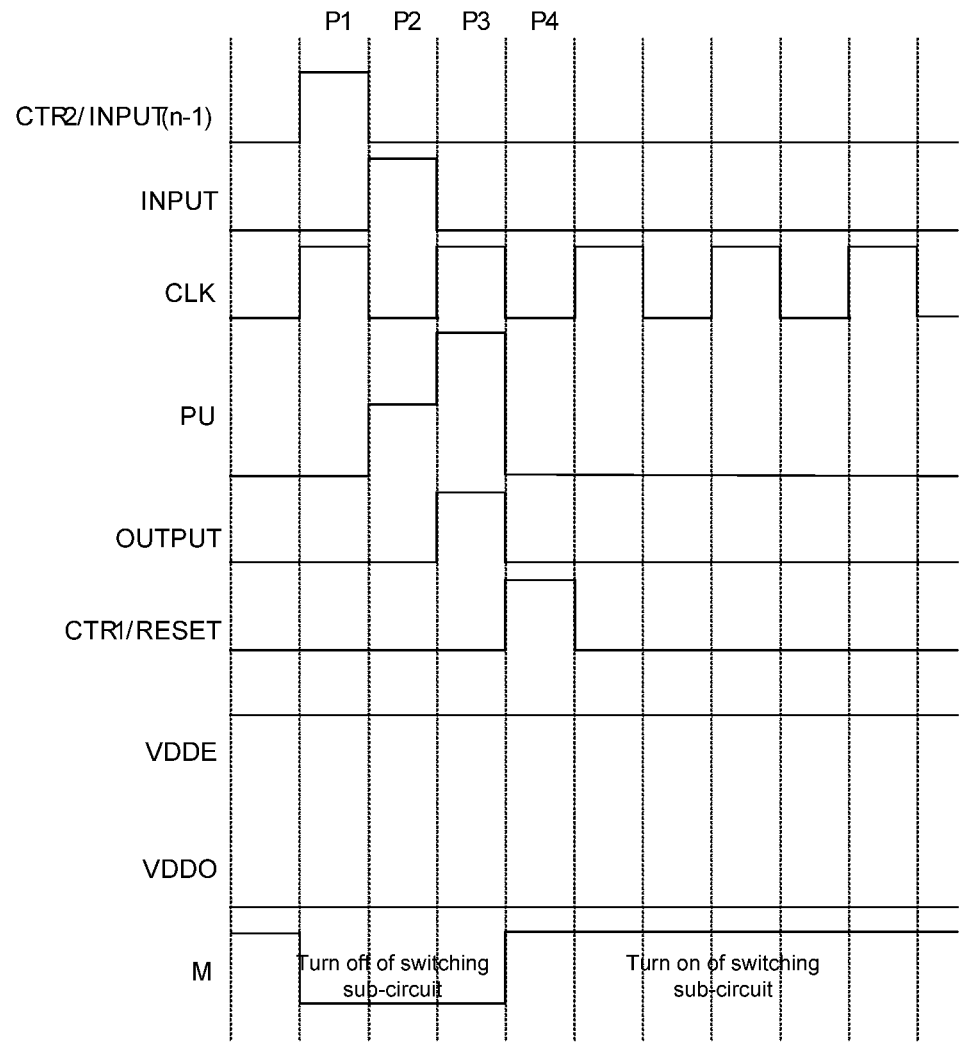
FIG. 10 is an operating timing diagram of a shift register according to an embodiment of the present disclosure.

FIG. 10 is an operating timing diagram of a shift register according to an embodiment of the present disclosure. Description will be made below in combination with the circuit structure of the shift register of FIG. 9.

During a first phase P1, that is, an initialization phase, an input signal at a signal input terminal INPUT(n−1) of a last stage is at a high level, so that the first trigger signal terminal CTR2 is at a high level. In each of the gating sub-circuits 13_A, 13_B, and 13_C, the third transistor T3 is turned on to pull down a potential at the gating node M, the first capacitor C1 is discharged, and the first transistor T1 is turned off, to be ready to perform a charging process.

During this phase, signals at the signal input terminal INPUT, the reset terminal RESET, and the second control terminal VDDO of the current stage of shift register are all at a low level, the sixth transistor T6 and the seventh transistor T7 are turned off, and the pull-up node PU is at a low level, so that the twelfth transistor T12 and the thirteenth transistor T13 are turned off, and thereby output signals at the signal output terminals OUTPUT (i.e., the first signal output terminal G_out and the second signal output terminal Out_C) are at a low level. During this phase, input signals at the clock signal terminal CLK and the first control terminal VDDE are at a high level.

During a second phase P2, that is, an input phase, the input signal at the signal input terminal INPUT is at a high level, the sixth transistor T6 is turned on, and the potential at the pull-up node PU is pulled up, to charge the second capacitor C2. Since the potential at the pull-up node PU is pulled up, the twelfth transistor T12 and the thirteenth transistor T13 are turned on, to wait for a signal input from the clock signal terminal CLK.

During this phase, the signal at the first control terminal VDDE is at a high level, the eighth transistor T8 and the ninth transistor T9 are turned on, the potential at the first pull-down node PD1 is pulled up, and the fourth transistors (i.e., the fourth transistors T4, T4', and T4") in all the gating sub-circuits 13_A, 13_B, and 13_C are turned on. However, since the first transistor T1 in each of the gating sub-circuits 13_A, 13_B, and 13_C is turned off, that is, each of the switching sub-circuits 131_A, 131_B and 131_C is in a turn-off state, the potentials at the pull-up node PU, the first signal output terminal G_out, and the second signal output terminal Out_C may not be affected by the de-noising sub-circuits 132_A, 132_B, and 132_C.

During this phase, the signals at the signal input terminal INPUT and the first control terminal VDDE are at a high level, the signals at the clock signal terminal CLK, the reset terminal RESET and the second control terminal VDDO are all at a low level, and the output signals at the first signal output terminal G_out and the second signal output terminal Out_C are at a low level.

During a third phase P3, that is, an output phase, the input signal at the signal input terminal INPUT is at a low level, the sixth transistor T6 is turned off, and the pull-up node PU is continuously maintained at a high level. The signal at the clock signal terminal CLK becomes a high level, and since the twelfth transistor T12 and the thirteenth transistor T13 have been turned on, the high level at the clock signal terminal CLK is output from the first signal output terminal G_out and the second signal output terminal Out_C. The first signal output terminal G_out is connected to grid lines in an effective display region of a display panel to drive pixels of the display panel. The second signal output terminal Out_C is connected to other shift registers respectively. For example, in a case where the current shift register is an $n^{th}$ stage of shift register in a gate driving circuit, the second signal output terminal Out_C of the $n^{th}$ stage of shift register is connected to a signal input terminal of an $(n+3)^{th}$ stage of shift register and a reset terminal of an $(n+4)^{th}$ stage of shift register, and a signal at the second signal output terminal Out_C acts as an input signal at the signal input terminal of the $(n+3)^{th}$ stage of shift register and a reset signal at the reset terminal of the $(n+4)^{th}$ stage of shift register respectively, that is, Out_C(n) is cascaded with INPUT(n+3) and RESET(n−4) respectively. Due to the bootstrap effect of the transistor, the potential at the pull-up node PU is continuously pulled up, to raise a voltage at the pull-up node PU. The increase in the voltage at the pull-up node PU improves the turn-on capacity of the third transistor T3 and the sixth transistor T6, and ensures the output of the first signal output terminal G_out and the second signal output terminal Out_C.

During this phase, the signal at the first control terminal VDDE is at a high level, the eighth transistor T8 and the ninth transistor T9 are turned on, the first pull-down node PD1 is maintained at a high potential, and the fourth transistors T4, T4', and T4" are turned on. However, since the first transistor T1 in each of the gating sub-circuits 13_A, 13_B, and 13_C is turned off, that is, the switching sub-circuits 131_A, 131_B, and 131_C are all in a turn-off state, the potentials at the pull-up node PU, the first signal output terminal G_out, and the second signal output terminal Out_C may not be affected by the de-noising sub-circuits 132_A, 132_B, and 132_C.

During this phase, the signals at the clock signal terminal CLK and the first control terminal VDDE are at a high level, the output signals at the first signal output terminal G_out and the second signal output terminal Out_C are at a high level, and the signals at the signal input terminal INPUT, the reset terminal RESET and the second control terminal VDDO are all at a low level.

During a fourth phase P4, that is, a reset phase, the reset terminal RESET receives a high-level reset signal. Since the reset terminal RESET is at a high level, the seventh transistor T7 is turned on. The seventh transistor T7 is turned on to discharge the pull-up node PU, to pull down the potential at the pull-up node PU to a low level at the low-level input terminal VGL, so that the twelfth transistor T12 and the thirteenth transistor T13 are turned off.

During this phase, the high-level input signal at the reset terminal RESET causes the second transistors T2 in the gating sub-circuits 13_A, 13_B, and 13_C to be turned on, to pull up the potential at the gating node M, so that the first transistors T1 are turned on. Thereby, the de-noising sub-circuits 132_A, 132_B, and 132_C pull down the potentials at the pull-up node PU, the first signal output terminal G_out, and the second signal output terminal Out_C to the low level at the low-level input terminal VGL respectively to perform de-noising. During this period, the first capacitor C1 is charged.

During this phase, the signal at the first control terminal VDDE is at a high level, the eighth transistor T8 and the ninth transistor T9 are turned on, and the first pull-down node PD1 is maintained at a high potential, so that the fourth transistors T4, T4', and T4" are turned on. Since the first transistors T1 in the switching sub-circuits 131_A, 131_B, and 131_C are turned on, that is, the switching sub-circuits 131_A, 131_B, and 131_C are in a turn-on state, the de-noising sub-circuit 132_A discharges the pull-up node PU, to pull down the potential at the pull-up node PU to the low level at the low-level input terminal VGL; the de-noising sub-circuit 132_B discharges the first signal output terminal G_out, to pull down the potential at the first signal output terminal G_out to the low level at the low-level input terminal VGL; and the de-noising sub-circuit 132_C discharges the second signal output terminal Out_C, to pull down the potential at the second signal output terminal Out_C to the low level at the low-level input terminal VGL.

During this phase, the signals at the reset terminal RESET and the first control terminal VDDE are at a high level, the signals at the signal input terminal INPUT, the clock signal terminal CLK, and the second control terminal VDDO are all at a low level, and the output signals at the first signal output terminal G_out and the second signal output terminal Out_C are at a low level.

After the fourth phase P4, since the input signal at the first control terminal VDDE is continuously at a high level, the eighth transistor T8 and the ninth transistor T9 are continuously turned on, the first pull-down node PD1 is continuously maintained at a high potential, and the fourth transistor T4, T4' and T4" are continuously turned on. Due to the presence of the first capacitors C1 in the switching sub-circuits 131_A, 131_B, and 131_C, the gating node M is maintained at a high level, so that the transistor T1 is continuously in a turn-on state. Therefore, the fourth transistor T4 in the de-noising sub-circuit 132_A continuously discharges the pull-up node PU, to pull down the potential at the pull-up node PU to the low level at the low-level input terminal VGL; the fourth transistor T4' in the de-noising sub-circuit 132_B continuously discharges the first signal output terminal G_out, to pull down the potential at the first signal output terminal G_out to the low level at the low-level input terminal VGL; and the fourth transistor T4" in the de-noising sub-circuit 132_A continuously discharges the second signal output terminal Out_C, to pull down the potential at the second signal output terminal Out_C to the low level at the low-level input terminal VGL. Although the signal at the clock signal terminal CLK may be periodically switched between a high level and a low level, since the twelfth transistor T12 and the thirteenth transistor T13 are continuously in a turn-off state after the fourth phase P4, the high level at the clock signal terminal CLK may not be output to the first signal output terminal G_out and the second signal output terminal Out_C.

It may be seen from the above operating process of the shift register according to the embodiments of the present disclosure that the shift register according to the present disclosure realizes de-noising of the de-noising node independently of the potential at the pull-up node by disposing gating sub-circuits, so that the charging process of the pull-up node is separated from the de-noising process of the pull-up node, thereby solving the problem of insufficient voltage of the gate driving signal in the conventional direct current de-noising type GOA architecture.

During a period (a first period) from the initialization phase (the first phase P1) to the output phase (the third phase P3), the switching sub-circuits 131_A, 131_B, and 131_C are in a turn-off state, to isolate the de-noising nodes (the pull-up node PU, the first signal output terminal G_out and the second signal output terminal Out_C) from the respective de-noising sub-circuits 132_A, 132_B, and 132_C, which ensures that the pull-up node PU is not affected by the de-noising sub-circuits during the charging phase, so that the pull-up node PU may be fully charged.

Starting from the reset phase (the fourth phase P4), the switching sub-circuits 131_A, 131_B, and 131_C are in a turn-on state, to connect the de-noising nodes to the respective de-noising sub-circuits 132_A, 132_B, and 132_C. Since the first pull-down node PD1 is continuously maintained at a high level, the fourth transistor T4 in the de-noising sub-circuit 132_A is in a normally-on state and continuously discharges the pull-up node PU; the fourth transistor T4' in the de-noising sub-circuit 132_B is in a normally-on state, and continuously discharges the first signal output terminal G_out; and the fourth transistor T4" in the de-noising sub-circuit 132_C is in a normally-on state, and continuously discharges the second signal output terminal Out_C. In this way, it is ensured that the pull-up node PU, the first signal output terminal G_out and the second signal output terminal Out_C are continuously at a low level, thereby reducing or even eliminating noise.

In addition, in the shift register according to the embodiments of the present disclosure, an input signal at a signal input terminal INPUT(n−1) of a last stage of shift register and a reset signal at a reset terminal RESET(n) of the current stage of shift register are used as trigger signals of the switching sub-circuits, which enables the switching sub-circuits to realize desired switching without adding additional terminals in the shift register, thereby enabling the de-noising process and the charging process to be performed in a time division manner.

In the conventional direct current de-noising type shift register, when the pull-up node PU is at a high level, a pair of transistors M6 and M8 are used to control the pull-down of the first pull-down node PD1, and a pair of transistors M6' and M8' are used to control the pull-down of the second pull-down node PD2 (as shown in FIG. 1). Compared with the conventional direct current de-noising type shift register, in the shift register according to the present disclosure, the de-nosing node is isolated from the respective de-noising sub-circuits during the charging phase by designing gating modules without two pairs of transistors (for example, the transistors M6 and M8 and transistors M6' and M8' in FIG. 1) for pull-down, so that the potential at the pull-up node is not affected by the de-noising sub-circuits. This eliminates the competition between the pull-up node and the pull-down node, so that the charging process and the de-noising process may be performed separately from each other, and thereby it may not only be ensured that the pull-up node may be fully charged, but also it may ensured that the potential at the pull-down node is stable. In the shift register, the pull-up node is independently charged more fully during the charging period, and the pull-up node, the first signal output terminal and the second signal output terminal are independently de-noised more efficiently during the de-noising period without affecting each other. In this way, the problems of insufficient charging or insufficient de-noising caused by the interaction between the charging process and the de-noising process may be avoided, which enhances the stability of the output signal of the shift register and the reliability of the use of the shift register, improves the display quality, and extends the service life.

In the conventional direct current de-noising type shift register, changes in the potentials at the first pull-down node PD1 and the second pull-down node PD2 may cause the characteristic drift of the transistors M5 and M5' and the transistors M9 and M9', which affects the de-noising capability. Compared with the conventional direct current de-noising type shift register, in the present disclosure, since the two pairs of transistors (for example, the transistors M6 and M8 and the transistors M6' and M8' in FIG. 1) for pull-down are omitted, the stability of the voltages at the first pull-down node PD1 and the second pull-down node PD2 is ensured, and the characteristic drift of the transistors caused by the changes in the potentials at the pull-down nodes is overcome, which further improves the de-noising capability and extends the life of the product.

Based on the inventive concept of the above embodiments, the embodiments of the present disclosure further provide a method for driving a shift register, which is applied to the above shift registers.

Figure 11:
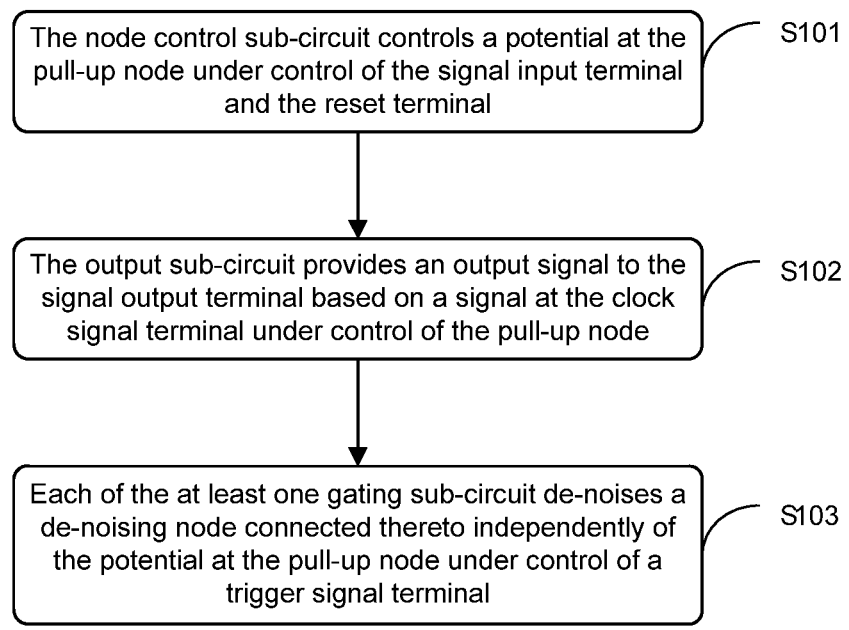
FIG. 11 is a flowchart of a method for driving a shift register according to an embodiment of the present disclosure.

FIG. 11 is a flowchart of a method for driving a shift register according to an embodiment of the present disclosure. As shown in FIG. 11, the method for driving a shift register may comprise steps S101 to S103.

In step S101, the node control sub-circuit controls a potential at the pull-up node under control of the signal input terminal and the reset terminal.

For example, when an input signal at the signal input terminal is at a high level, the pull-up node control sub-circuit controls the potential at the pull-up node to be at a high level; and when an input signal at the reset terminal is at a high level, the pull-up node control sub-circuit controls the potential at the pull-up node to be at a low level. When an input signal at the first control terminal is at a high level, the pull-down node control sub-circuit controls a potential at the first pull-down node to be at a high level; and when an input signal at the second control terminal is at a high level, the pull-down node control sub-circuit controls a potential at the second pull-down node to be at a high level.

In step S102, the output sub-circuit provides an output signal to the signal output terminal based on a signal at the clock signal terminal under control of the pull-up node.

For example, when the pull-up node is at a high level, the twelfth transistor and the thirteenth transistor are turned on, and the signal at the clock signal terminal is output from the first signal output terminal and the second signal output terminal.

In step S103, the gating sub-circuit performs de-noising in a time division manner under control of a trigger signal.

For example, when an input signal at a signal input terminal of a last stage is at a high level, each of the at least one gating sub-circuit de-noises a de-noising node connected thereto independently of the potential at the pull-up node. For example, when the input signal at the signal input terminal of the last stage is at a high level, in each of the gating sub-circuits, the third transistor in the switching sub-circuit is turned on to pull down the potential at the gating node, so as to discharge the second capacitor. The low potential at the gating node causes the first transistor to be turned off, to isolate the de-noising node from the de-noising sub-circuit. When a signal at the reset terminal is at a high level, the switching sub-circuit in each of the gating sub-circuits connects the de-noising node to the de-noising sub-circuit, so that the de-noising sub-circuit de-noises the de-noising node. For example, when the signal at the reset terminal is at a high level, in each of the gating sub-circuits, the second transistor of the switching sub-circuit is turned on, to pull up the potential at the gating node, the first transistor is turned on, and the respective de-noising sub-circuits pull down potentials at the pull-up node, the first signal output terminal and the second signal output terminal to a low level respectively to perform de-noising. The first capacitor is charged during a period in which the gating node is at a high level.

Figure 12:
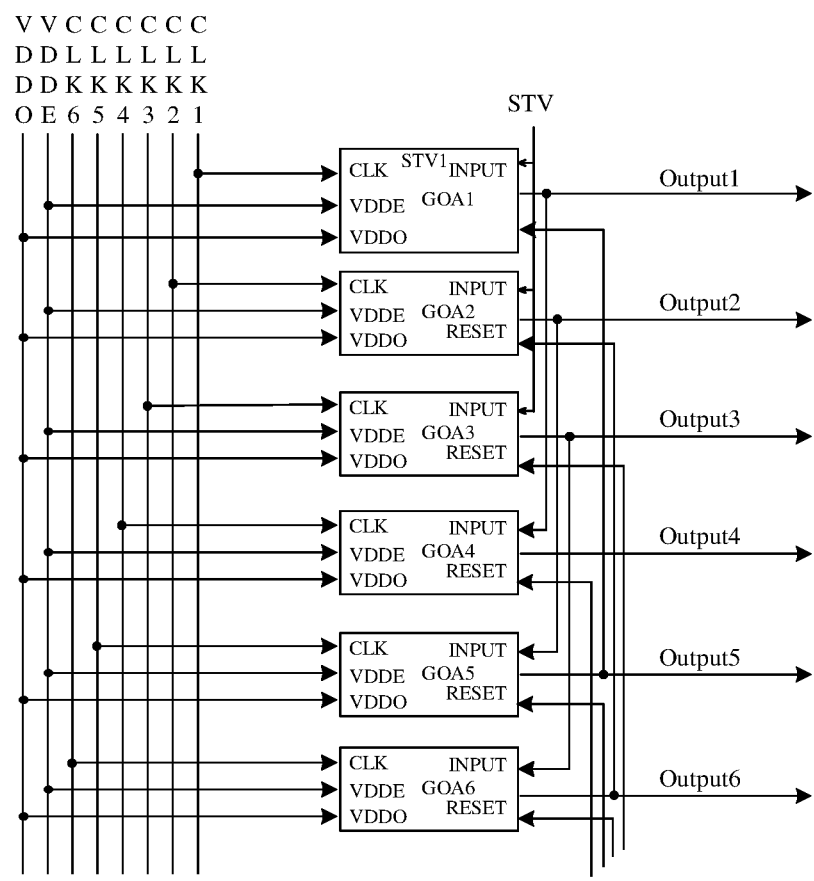
FIG. 12 is a schematic structural diagram of a gate driving circuit according to an embodiment of the present disclosure.

FIG. 12 is a schematic structural diagram of a gate driving circuit according to an embodiment of the present disclosure. Based on the inventive concept of the above embodiments, the embodiments of the present disclosure further provide a gate driving circuit. As shown in FIG. 12, the gate driving circuit according to the embodiment of the present disclosure comprises a plurality of cascaded shift registers GOA1 to GOAN (wherein N is an integer greater than 1, and only six cascaded shift registers are shown in the figure for the sake of simplicity.) Each of the shift registers GOA1 to GOAN may be the shift register according to the above embodiments, and details thereof will not be described herein again.

In FIG. 12, a first signal output terminal of an $n^{th}$ stage of shift register GOA(n) outputs a gate driving signal to an $n^{th}$ row of gate lines in a display region, and a second signal output terminal of the $n^{th}$ stage of shift register GOA(n) is connected to a signal input terminal IN of an $(n+3)^{th}$ stage of shift register GOA(n+3). The second signal output terminal of the $n^{th}$ stage of shift register is connected to a reset terminal RST of an $(n-4)^{th}$ stage of shift register GOA(n-4). Here, for the sake of simplicity, an output signal at the first signal output terminal and an output signal at the second signal output terminal of the $n^{th}$ stage of shift register GOA(n) are collectively represented by Output(n). N is an integer greater than 4, n is an integer, and 4<n<N−3. Signal input terminals INPUT of a first stage of shift register GOA1 to a third stage of shift register GOA3 may be connected to receive a start signal STV.

A trigger signal terminal of each of the shift registers comprises a first trigger signal terminal and a second trigger signal terminal. For example, a switching sub-circuit of each of the shift registers may have the structure shown in FIG. 8, for example. A first trigger signal terminal CTR1($n$) of the $n^{th}$ stage of shift register GOA(n) may be a reset terminal REST(n) of the $n^{th}$ stage of shift register, and a second trigger signal terminal CTR2($n$) of the $n^{th}$ stage of shift register GOA(n) may be connected to a signal input terminal INPUT(n−1) of an $(n-1)^{th}$ stage of shift register GOA(n−1).

Based on the inventive concept of the above embodiments, the embodiments of the present disclosure further provide a display apparatus comprising the gate driving circuit according to the above embodiments. The display apparatus may be any product or component having a display function, such as a mobile phone, a tablet computer, a television, a display, a notebook computer, a digital photo frame, a navigator, etc.

In the description of the embodiments of the present disclosure, it should be understood that oriental or positional relationships indicated by terms "middle", "up", "down", "front", "rear", "vertical", "horizontal", "top", "bottom", "inside", "outside" etc. are based on oriental or positional relationships shown in the accompanying drawings, and are only used for the convenience of describing the present disclosure and simplifying the description, rather than indicating or implying that an apparatus or element which is referred to must have a specific orientation, and is constructed and operated in a specific orientation, and therefore may not be understood as limitations on the present disclosure.

In the description of the embodiments of the present disclosure, it should be illustrated that the terms "installation", "connected with", and "connected to" should be understood in a broad sense unless explicitly stated and defined otherwise. For example, they may be fixed connections or detachable connections or integral connections; may be mechanical connections or electrical connections; may be direct connections or indirect connections through an intermediate medium, or may be internal connections in two elements. For those of ordinary skill in the art, specific meanings of the above terms in the present disclosure may be understood according to specific conditions.

Although the embodiments disclosed in the present disclosure are as described above, the content described is only embodiments for facilitating understanding of the present disclosure, and is not intended to limit the present disclosure. Any skilled in the art to which the present disclosure belongs may make any modifications and changes in the form and details of implementations without departing from the spirit and scope disclosed in the present disclosure, but the patent protection scope of the present disclosure must still be based on the scope defined by the appended claims.

We claim:

1. A shift register, comprising:
  a node control sub-circuit connected to a signal input terminal, a reset terminal, and a pull-up node, and configured to control a potential at the pull-up node under control of the signal input terminal and the reset terminal;
  an output sub-circuit connected to the pull-up node, a clock signal terminal, and a signal output terminal, and configured to provide an output signal to the signal output terminal based on a signal at the clock signal terminal under control of the pull-up node; and
  at least one gating sub-circuit connected to at least one de-noising node respectively, each gating sub-circuit being configured to de-noise a respective de-noising node connected thereto independently of the potential at the pull-up node under control of a trigger signal terminal, wherein the at leas t one de-noising node comprises at least one of the pull-up node and the signal output terminal;
  wherein each of the at least one gating sub-circuit comprises a switching sub-circuit and a de-noising sub-circuit, wherein:
    the switching sub-circuit has a first terminal connected to the de-noising node, and a second terminal connected to the de-noising sub-circuit, and is configured to connect the first terminal to the second terminal or isolate the first terminal from the second terminal under control of the trigger signal terminal; and
    the de-noising sub-circuit is connected to a pull-down node and the second terminal of the switching sub-circuit, and is configured to de-noise the second terminal of the switching sub-circuit under control of the pull-down node.

2. The shift register according to claim 1, wherein the trigger signal terminal comprises a first trigger signal terminal and a second trigger signal terminal, and the switching sub-circuit comprises a first transistor, a second transistor, a third transistor, and a first capacitor, wherein:
the first transistor has a gate connected to a gating node, a first electrode acting as the first terminal of the switching sub-circuit, and a second electrode acting as the second terminal of the switching sub-circuit;
the second transistor has a gate connected to the first trigger signal terminal, a first electrode connected to a first voltage terminal, and a second electrode connected to the gating node;
the third transistor has a gate connected to the second trigger signal terminal, a first electrode connected to the gating node, and a second electrode connected to a second voltage terminal; and
the first capacitor has a first terminal connected to the gating node, and a second terminal connected to the second voltage terminal.

3. The shift register according to claim 2, wherein the first trigger signal terminal is the reset terminal, and the second trigger signal terminal is connected to a signal input terminal of another shift register in a gate driving circuit where the shift register is located.

4. The shift register according to claim 1, wherein the pull-down node comprises a first pull-down node and a second pull-down node, and the de-noising sub-circuit comprises a fourth transistor and a fifth transistor, wherein:
the fourth transistor has a gate connected to the first pull-down node, a first electrode connected to the second terminal of the switching sub-circuit, and a second electrode connected to a second voltage terminal; and
the fifth transistor has a gate connected to the second pull-down node, a first electrode connected to the second terminal of the switching sub-circuit, and a second electrode connected to the second voltage terminal.

5. The shift register according to claim 1, wherein the node control sub-circuit comprises:
a pull-up node control sub-circuit connected to the signal input terminal, the reset terminal, and the pull-up node, and configured to input a signal at the signal input terminal to the pull-up node, and reset the potential at the pull-up node under control of a signal at the reset terminal; and
a pull-down node control sub-circuit connected to a first control terminal, a second control terminal, a first pull-down node and a second pull-down node, and configured to control a potential at the first pull-down node under control of a signal at the first control terminal and control a potential at the second pull-down node under control of a signal at the second control terminal.

6. The shift register according to claim 5, wherein the pull-up node control sub-circuit comprises a sixth transistor and a seventh transistor, wherein:
the sixth transistor has a gate and a first electrode connected to the signal input terminal, and a second electrode connected to the pull-up node; and
the seventh transistor has a gate connected to the reset terminal, a first electrode connected to the pull-up node, and a second electrode connected to a second voltage terminal.

7. The shift register according to claim 5, wherein the pull-down node control sub-circuit comprises an eighth transistor, a ninth transistor, a tenth transistor, and an eleventh transistor, wherein:
the eighth transistor has a gate and a first electrode connected to the first control terminal, and a second electrode connected to a gate of the ninth transistor;
the ninth transistor has the gate connected to the second electrode of the eighth transistor, a first electrode connected to the first control terminal, and a second electrode connected to the first pull-down node;
the tenth transistor has a gate and a first electrode connected to the second control terminal, and a second electrode connected to a gate of the eleventh transistor; and
the eleventh transistor has the gate connected to the second electrode of the tenth transistor, a first electrode connected to the second control terminal, and a second electrode connected to the second pull-down node.

8. The shift register according to claim 1, wherein the signal output terminal comprises a first signal output terminal and a second signal output terminal, and the output sub-circuit comprises a second capacitor, a twelfth transistor, and a thirteenth transistor, wherein:
the twelfth transistor has a gate connected to the pull-up node, a first electrode connected to the clock signal terminal, and a second electrode connected to the first signal output terminal;
the thirteenth transistor has a gate connected to the pull-up node, a first electrode connected to the clock signal terminal, and a second electrode connected to the second signal output terminal; and
the second capacitor has a first terminal connected to the pull-up node, and a second terminal connected to the first signal output terminal.

9. The shift register according to claim 1, wherein the at least one de-noising node comprises the pull-up node, and the at least one gating sub-circuit comprises a first gating sub-circuit connected to the pull-up node.

10. The shift register according to claim 1, wherein the signal output terminal comprises a first signal output terminal, the at least one de-noising node comprises the pull-up node and the first signal output terminal, and the at least one gating sub-circuit comprises a first gating sub-circuit connected to the pull-up node and a second gating sub-circuit connected to the first signal output terminal.

11. The shift register according to claim 1, wherein the signal output terminal comprises a first signal output terminal and a second signal output terminal, the at least one de-noising node comprises the pull-up node, the first signal output terminal and the second signal output terminal, and the at least one gating sub-circuit comprises a first gating sub-circuit connected to the pull-up node, a second gating sub-circuit connected to the first signal output terminal, and a third gating sub-circuit connected to the second signal output terminal.

12. The shift register according to claim 1, wherein the signal output terminal comprises a first signal output terminal and a second signal output terminal, the at least one de-noising node comprises the pull-up node, the first signal output terminal and the second signal output terminal, and the at least one gating sub-circuit comprises a first gating sub-circuit connected to the pull-up node, a second gating sub-circuit connected to the first signal output terminal, and a third gating sub-circuit connected to the second signal output terminal.

13. A gate driving circuit, comprising a plurality of cascaded shift registers according to claim 1, wherein a signal output terminal of an $n^{th}$ stage of shift register is connected to a signal input terminal of an $(n+3)^{th}$ stage of shift register and a reset terminal of an $(n-4)^{th}$ stage of shift register, wherein N is an integer greater than 4, n is an integer, and 4<n<N−3.

14. The gate driving circuit according to claim 13, wherein a trigger signal terminal of each of the shift registers comprises a first trigger signal terminal and a second trigger signal terminal, wherein a first trigger signal terminal of the $n^{th}$ stage of shift register is a reset terminal of the $n^{th}$ stage of shift register, and a second trigger signal terminal of the $n^{th}$ stage of shift register is connected to a signal input terminal of an $(n-1)^{th}$ stage of shift register.

15. A display apparatus, comprising the gate driving circuit according to claim 13.

16. A method for driving the shift register according to claim 1, the method comprising:
controlling, by the node control sub-circuit, a potential at the pull-up node under control of the signal input terminal and the reset terminal;
providing, by the output sub-circuit, an output signal to the signal output terminal based on a signal at the clock signal terminal under control of the pull-up node; and
de-noising, by each of the at least one gating sub-circuit, a de-noising node connected thereto independently of the potential at the pull-up node under control of a trigger signal terminal.

17. The method according to claim 16, wherein the de-noising, by each of the at least one gating sub-circuit, a de-noising node connected thereto independently of the potential at the pull-up node under control of a trigger signal terminal comprises:
during a first period, isolating, by the switching sub-circuit of the gating sub-circuit, a first terminal of the switching sub-circuit from a second terminal of the switching sub-circuit under control of the trigger signal terminal; and
during a second period, connecting, by the switching sub-circuit of the gating sub-circuit, the first terminal of the switching sub-circuit to the second terminal of the switching sub-circuit under control of the trigger signal terminal, and de-noising, by the de-noising sub-circuit of the gating sub-circuit, the second terminal of the switching sub-circuit of the gating sub-circuit under control of the pull-down node.

18. The method according to claim 17, wherein the trigger signal terminal comprises a first trigger signal terminal and a second trigger signal terminal, the switching sub-circuit comprises a first transistor, a second transistor, a third transistor, and a first capacitor, and for each gating sub-circuit,
during a first part of the first period, the second trigger signal terminal is at a high level and the third transistor is turned on to pull down a potential at a gating node to a low level at a second voltage terminal, so as to turn off the first transistor; and
during a second part of the first period, the second trigger signal is at a low level, and the first capacitor causes the gating node to be maintained at a low level, so as to cause the first transistor to be maintained to be turned off.

19. The method according to claim 17, wherein the trigger signal terminal comprises a first trigger signal terminal and a second trigger signal terminal, the switching sub-circuit comprises a first transistor, a second transistor, a third transistor and a first capacitor, and for each gating sub-circuit,
during the second period, the first trigger signal terminal is at a high level and the second transistor is turned on to pull up a potential at a gating node to a high level at a first voltage terminal, so as to turn on the first transistor to cause the de-noising sub-circuit of the gating sub-circuit to be connected to the de-noising node, and the de-noising sub-circuit pulls down the potential at the de-noising node connected thereto to a low level at a second voltage terminal under control of the pull-down node.

* * * * *